(12) United States Patent
Chen et al.

(10) Patent No.: US 6,537,883 B2
(45) Date of Patent: Mar. 25, 2003

(54) METHOD FOR REDUCING PLASMA DAMAGE TO A GATE OXIDE OF A METAL-OXIDE SEMICONDUCTOR WAFER

(75) Inventors: Yi-Fan Chen, Tai-Chung (TW); Chi-King Pu, Chia-I (TW); Shou-Kong Fan, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/063,388

(22) Filed: Apr. 17, 2002

(65) Prior Publication Data

US 2002/0155680 A1 Oct. 24, 2002

Related U.S. Application Data

(62) Division of application No. 09/836,258, filed on Apr. 18, 2001.

(51) Int. Cl.[7] .............................................. H01L 21/336
(52) U.S. Cl. ...................... 438/281; 438/215; 438/637; 438/601; 257/356; 257/529
(58) Field of Search ................................. 438/454, 215, 438/281, 601, 637, 710, 798; 257/355, 529, 530, 499, 356, 546

(56) References Cited

U.S. PATENT DOCUMENTS

| | | | | |
|---|---|---|---|---|
| 5,760,445 A | * | 6/1998 | Diaz | 257/356 |
| 6,034,433 A | * | 3/2000 | Beatty | 257/355 |
| 6,060,347 A | * | 5/2000 | Wang | 438/215 |
| 6,323,076 B1 | * | 11/2001 | Wilford | 438/215 |

* cited by examiner

Primary Examiner—David Nelms
Assistant Examiner—Andy Huynh
(74) Attorney, Agent, or Firm—Winston Hsu

(57) ABSTRACT

The present invention provides a method for reducing plasma damage to a gate oxide of a metal-oxide semiconductor (MOS) transistor positioned on a substrate of a MOS semiconductor wafer. The method begins with the formation of a dielectric layer covering the MOS transistor on the substrate. An etching process is then performed to form a first contact hole through the dielectric layer to a gate on the surface of the MOS transistor, as well as to form a second contact hole through the dielectric layer to an n-well in the substrate. A bypass circuit, positioned on the dielectric layer and the first and second contact holes, and a fusion area are then formed. The fusion area, electrically connecting with the bypass circuit, also electrically connects with the MOS transistor and the n-well thereafter. Ions produced during the process are thus transferred to the n-well via the conductive wire so as to reduce plasma damage to the gate oxide. The fusion area is finally disconnected after the formation of the MOS transistor.

7 Claims, 11 Drawing Sheets

METHOD FOR REDUCING PLASMA DAMAGE TO A GATE OXIDE OF A METAL-OXIDE SEMICONDUCTOR WAFER

CROSS REFERENCE TO RELATED APPLICATIONS

This application is a division of application Ser. No. 09/836,258 filed on Apr. 18, 2001.

BACKGROUND OF INVENTION

1. Field of the Invention

The present invention relates to method of forming a bypass circuit on a metal-oxide semiconductor (MOS) transistor, and more specifically, to a method of forming a bypass circuit for reducing plasma damage to a gate oxide of the MOS transistor.

2. Description of the Prior Art

A metal-oxide semiconductor (MOS) is a common electrical device used in integrated circuits. The MOS transistor is a unit, having four nodes, formed by a gate, a source and a drain. By utilizing channel effects generated by the gate of the MOS under different gate voltages, the MOS is often made to function as a digitalized solid switch applied on various integrated circuits of memory or logic devices.

Please refer to FIG. 1 to FIG. 4 of cross-sectional views of manufacturing a MOS transistor according to the prior art. As shown in FIG. 1, a silicon substrate 12, a gate oxide layer 14 and a gate 16 are formed, respectively, on a semiconductor wafer 10.

As shown in FIG. 2, a first ion implantation process 18 is performed to form two doped areas, employed as a lightly doped drain (LDD) 22 of the MOS transistor, located on either side of the gate 16 on the surface of the silicon substrate 12. The LDD 22 is also called a source-drain extension (SDE).

As shown in FIG. 3, a spacer 24, comprising an insulating material, is then formed on either vertical wall of the gate 16. As shown in FIG. 4, a second ion implantation process 26 is performed to form two doped areas, employed as a source 27 and a drain 28 of the MOS transistor, positioned on portions of the silicon substrate 12 adjacent to the spacer 24 to complete the manufacturing of the MOS transistor.

Please refer to FIG. 5 of the cross-sectional view of performing a self-alignment silicide process, which is frequently performed after the formation of the MOS transistor to reduce the contact resistance of each silicon surface on the MOS transistor, on a MOS transistor. As shown in FIG. 5, a silicide layer 32 is formed on the surfaces of the gate 16, the source 27 and the drain 28 of the MOS transistor after the self-alignment silicide process.

However, a huge amount of ions accumulate in the gate 16 as a result of ultraviolet (UV) radiation during a plasma etching, ion bombardment and photo process. The accumulated ions may penetrate from the gate 16 into the gate oxide layer 14 and the silicon substrate 12, causing the antenna effect that leads to the degradation of the gate oxide layer 14, which is called plasma process induced damage (PPID). Consequently, the electrical performance of the MOS transistor is flawed.

SUMMARY OF INVENTION

It is therefore a primary object of the present invention to provide a method for reducing plasma damage to a gate oxide of a metal-oxide semiconductor (MOS) transistor, in order to prevent the gate oxide layer of the MOS transistor from the plasma process induced damage (PPID).

According to the claimed invention, the MOS transistor is positioned on a substrate of a semiconductor wafer. A dielectric layer is formed to cover the MOS transistor on the substrate. An etching process is then performed to form a first contact hole through the dielectric layer down to a gate on the surface of the MOS transistor, and to simultaneously form a second contact hole through the dielectric layer down to an n-well in the substrate. A bypass circuit and a fusion area are formed to electrically connect the MOS transistor and the n-well thereafter. The bypass circuit comprises a metal layer and is positioned on the dielectric layer and on both the first and second contact holes, and the fusion area is composed of polysilicon or a narrow line. The fusion area is electrically cut off by performing a thermal process or by using a laser beam after the formation of the MOS transistor.

It is an advantage of the present invention against the prior art that a bypass circuit is formed to electrically connect the MOS transistor and the n-well, so that accumulated ions in the gate oxide, as a result of ultraviolet (UV) radiation during the plasma etching, ion bombardment and photo process, is transferred to the n-well via the bypass circuit so as to neutralize the ions in the n-well. Therefore, the antenna effect is prevented and the plasma process induced damage to the gate oxide is reduced as well.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
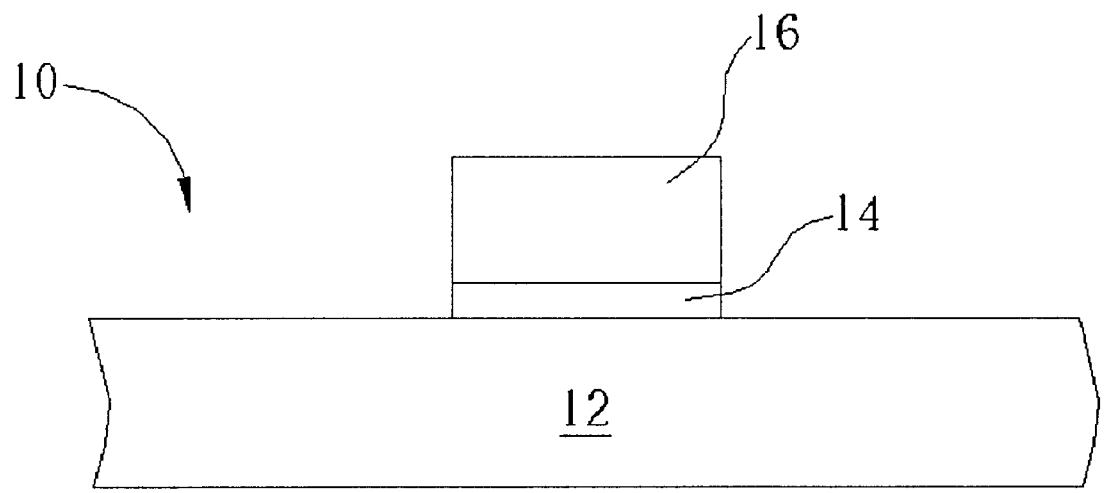
FIG. 1 to FIG. 4 are cross-sectional views of manufacturing a MOS transistor according to the prior art.
Figure 2:
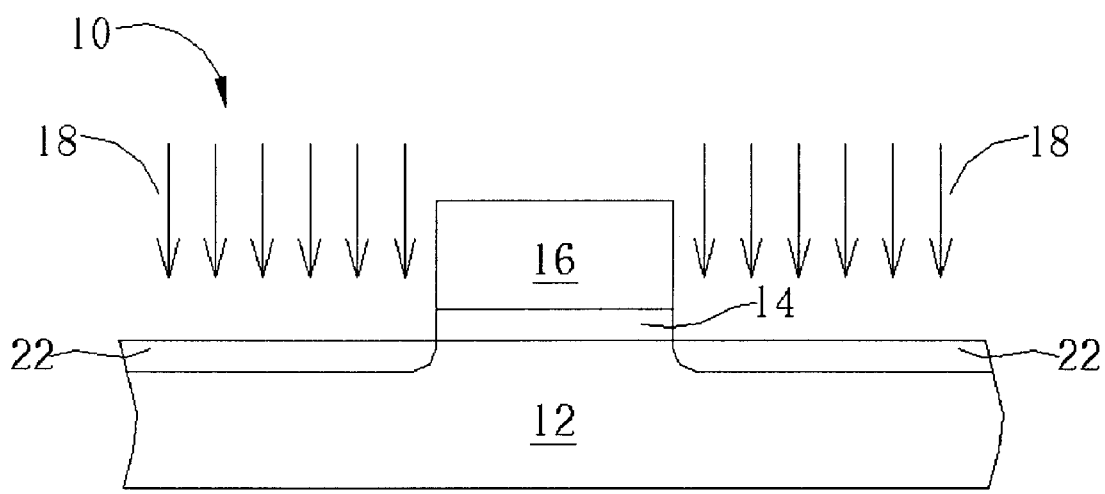
Figure 3:
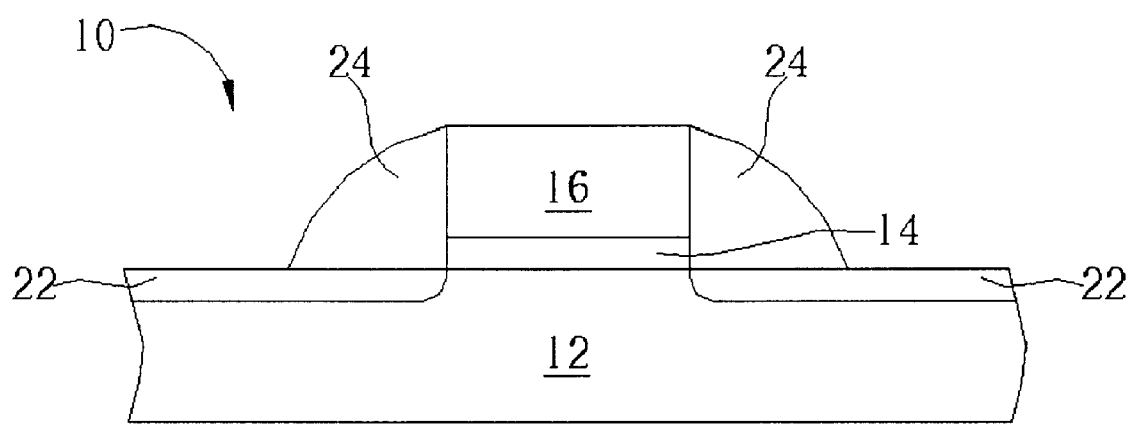
Figure 4:
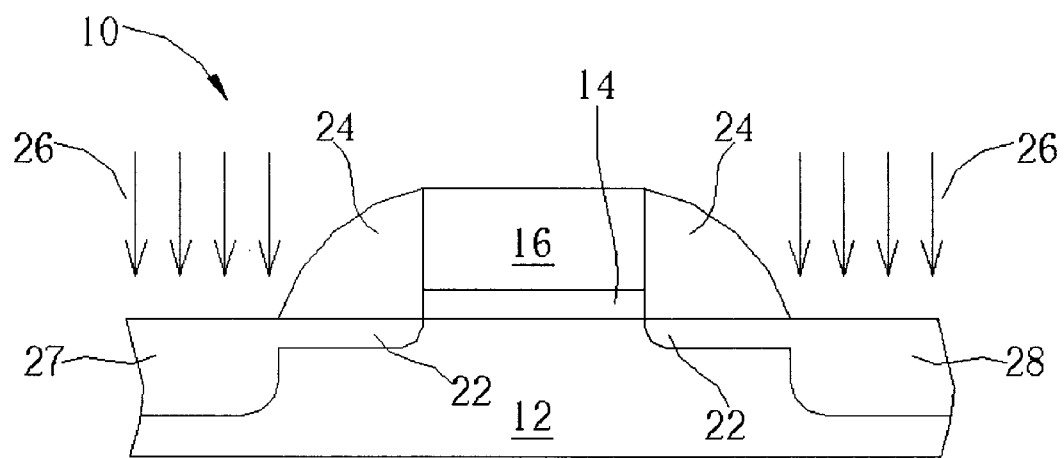
Figure 5:
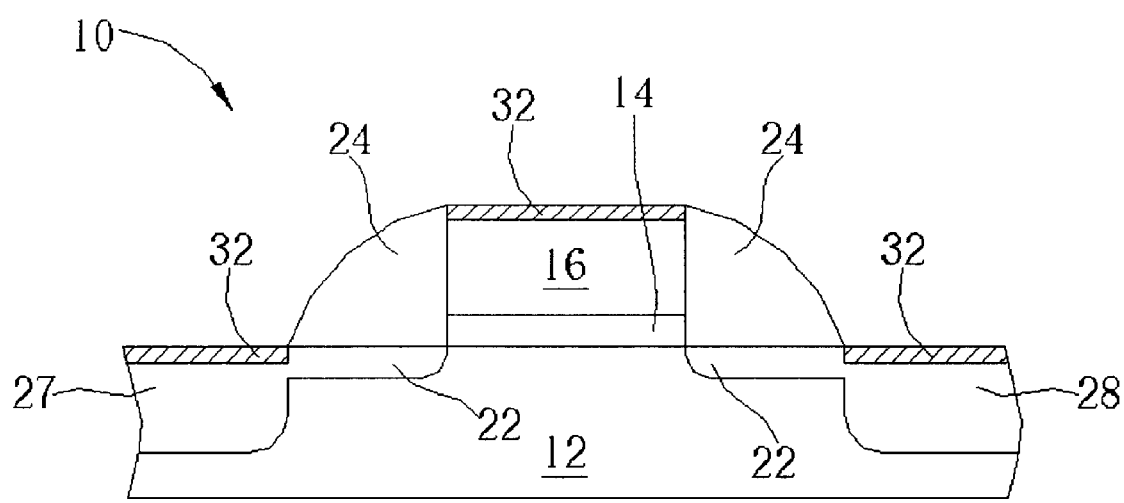
FIG. 5 is the cross-sectional view of performing a self-alignment silicide process on a MOS transistor according to the prior art.
Figure 6:
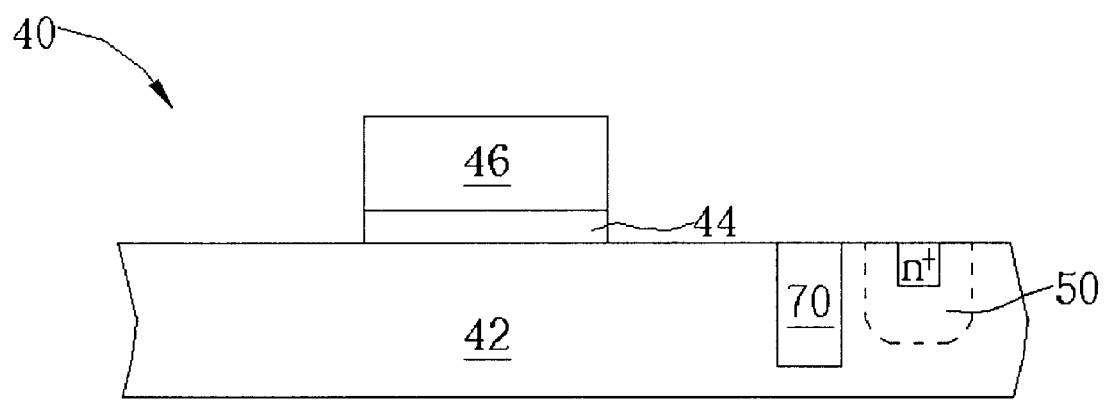
FIG. 6 to FIG. 11 are the cross-sectional views of a method for reducing plasma damage to a gate oxide of a MOS transistor according to the present invention.

Please refer to FIG. 6 to FIG. 11 of cross-sectional views of a method for reducing plasma process induced damage (PPID) to a gate oxide of a MOS transistor according to the present invention. As shown in FIG. 6, a silicon substrate 42, a gate oxide layer 44 and a gate 46 are formed, respectively, on a semiconductor wafer 40. An n-well 50, isolated from the MOS transistor by a shallow trench insulator (STI) structure 70, is set in a portion of the substrate 42 a distance away from the gate 46.

Figure 7:
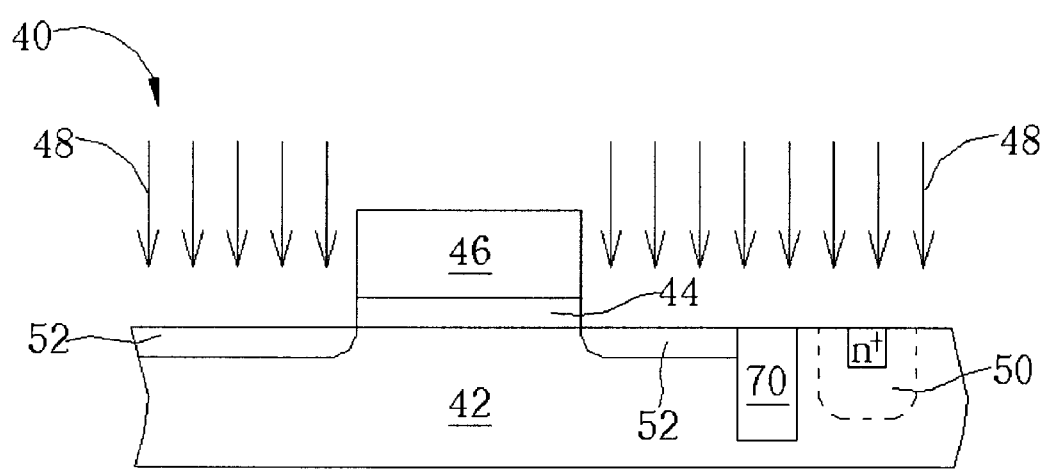

As shown in FIG. 7, a first ion implantation process 48 is performed to form two doped areas, employed as the lightly doped drain (LDD) 52 of the MOS transistor, on either side of the gate 46 on the surface of the silicon substrate 42. The LDD 52 is also called a source-drain extension (SDE).

Figure 8:
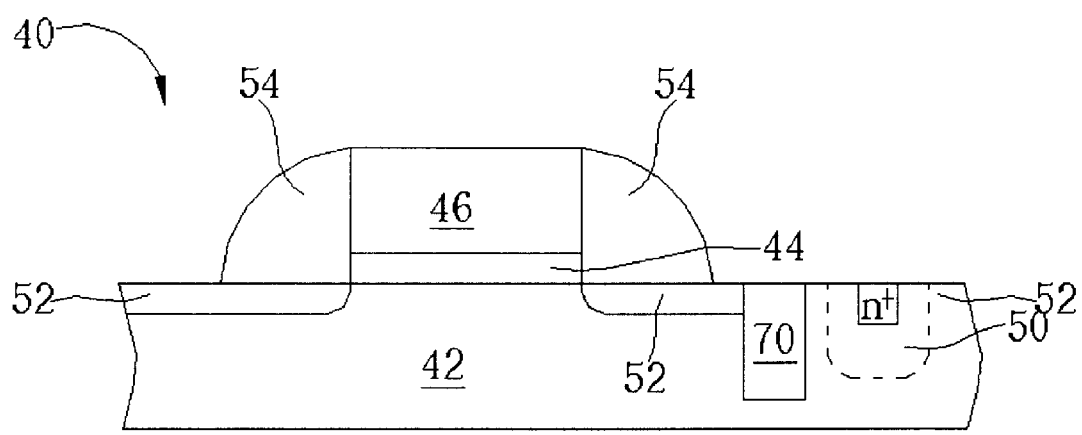
Figure 9:
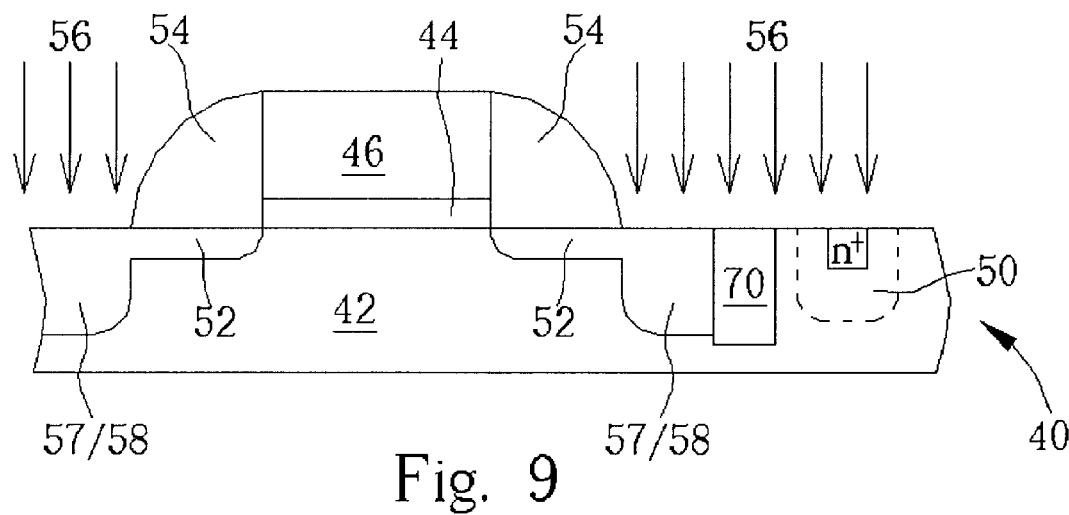

As shown in FIG. 8, a spacer 54, comprising an insulating material, is then formed on either vertical wall of the gate 46. As shown in FIG. 9, a second ion implantation process 56 is performed to form two doped areas, employed as a source 57 and a drain 58 of the MOS transistor, in a portion of the silicon substrate 42 adjacent to the spacer 54.

Figure 10:
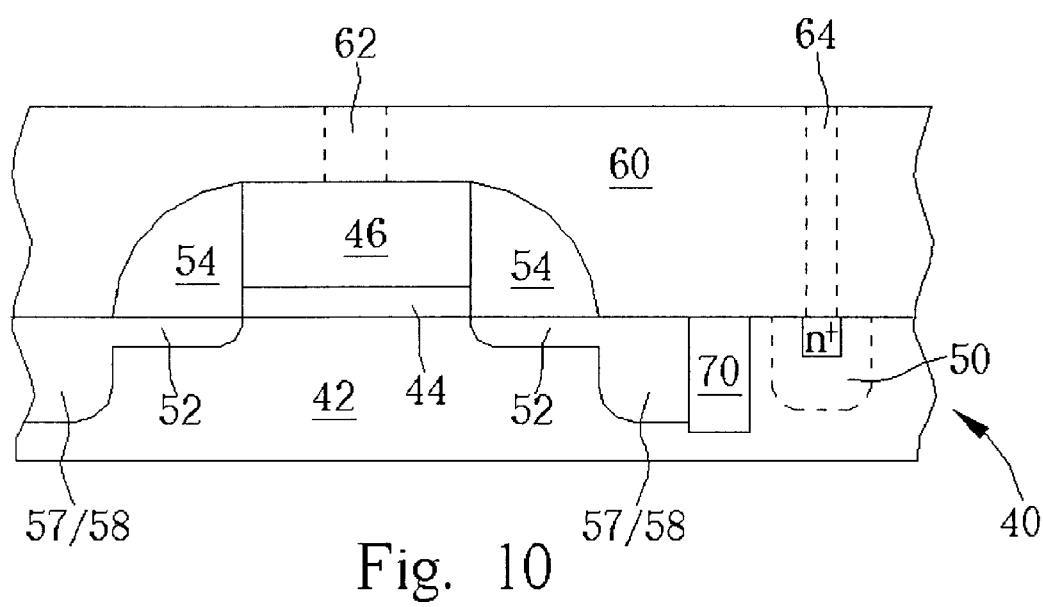
Figure 11:
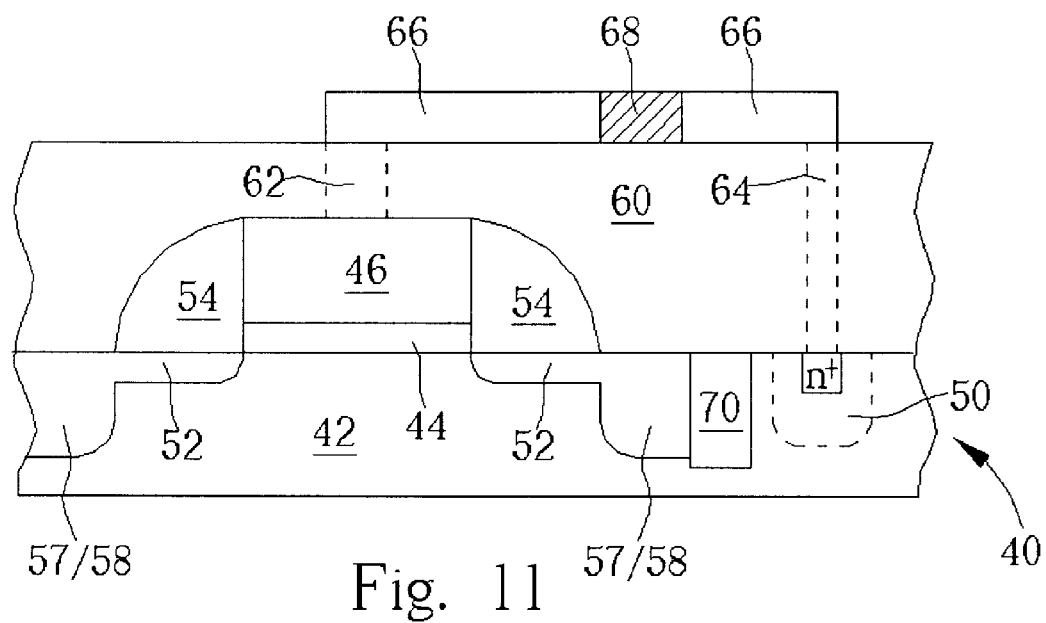

As shown in FIG. 10, a dielectric layer 60 is formed to cover the MOS transistor. An etching process is then performed to form a first contact hole 62 through the dielectric layer 60 down to the surface of the MOS transistor, and to simultaneously form a second contact hole 64 through the dielectric layer 60 down to the n-well 50 in the silicon substrate 42. As shown in FIG. 11, a bypass circuit 66, a portion of a metal interconnect layer, and a plug comprising tungsten (W) or other conductive materials, are positioned on the dielectric layer 60 and the first and the second contact holes 62 and 64. A fusion area, electrically connected with the bypass circuit 66, is formed to electrically connect the MOS transistor and the n-well thereafter. A deposition and a photo-etching-process (PEP) is then performed to form the metal an interconnect layer and to define the patterns of the bypass circuit 66. A deposition and the photo-etching-process is again performed to form a fusion area 68 of the bypass circuit 66 on the dielectric layer 60 to electrically connect the MOS transistor and the n-well 50. Ions accumulated in the gate oxide as a result of ultraviolet (UV) radiation during the subsequent plasma etching, ion bombardment and photo process is thus transferred to the n-well 50 via the bypass circuit 66 to neutralize the ions in the n-well 50 and reduce plasma damage to the gate oxide layer 44.

Alternatively, the fusion area 68 of the bypass circuit 66 on the dielectric layer 60 is formed before the metal interconnect layer, electrically connected with the MOS transistor, fusion area 68 and the n-well 50, is formed. In another embodiment of the present invention, the fusion area 68 is formed during the formation of the gate 46 by performing the photo-etching-process employed to define patterns of the gate 46 and to form both the gate 46 and the bypass circuit 66. The fusion area 68 is electrically cut off by performing a thermal process or by using a laser beam after the MOS transistor is formed.

In comparison with the prior art, the present invention electrically connects the MOS transistor and the n-well via a bypass circuit. Consequently, ions accumulated in the gate oxide layer as a result of ultraviolet (UV) radiation during the plasma etching, ion bombardment and photo process are transmitted to the n-well via the bypass circuit so as to neutralize the ions in the n-well. Therefore, the antenna effect, leading to the degradation of the gate oxide layer, caused by the penetration of ions from the gate into the silicon substrate is prevented. Consequently, the plasma process induced damage (PPID) to the gate oxide is reduced, and the proper functioning of the MOS transistor is ensured.

Those skilled in the art will readily observe that numerous modifications and alterations of the device may-be made while retaining the teachings of the invention. Accordingly, the above disclosure should be construed as limited only by the metes and bound of the appended claims.

What is claimed is:

1. A method for reducing plasma damage to a gate oxide of a metal-oxide semiconductor (MOS) wafer, the MOS transistor positioned on a substrate of a semiconductor wafer, the method comprising:

forming a dielectric layer covering the MOS transistor on the substrate;

etching the dielectric layer to form a first contact hole through to a surface of the MOS transistor, and to form a second contact hole through to a doped region in the substrate;

forming a bypass circuit on the dielectric layer and in the first and second contact hole, and a fusion area electrically connecting with the bypass circuit to electrically connect the MOS transistor and the doped region, the fusion area comprising polysilicon; and disconnecting the fusion area after formation of the MOS transistor;

wherein ions in the gate oxide are transmitted to the doped region via the conductive wire so as to reduce plasma damage to the gate oxide.

2. The method of claim 1 wherein the bypass circuit is made of a metal layer.

3. The method of claim 1 wherein the bypass circuit is a portion of a metal interconnect layer.

4. The method of claim 1 wherein the doped region is an n-well.

5. The method of claim 1 wherein a thermal way is performed on the fusion area so as to cutoff the fusion area.

6. The method of claim 1 wherein a laser beam is used to irradiate the fusion area so as to cutoff the fusion area.

7. The method of claim 1 wherein ions in the gate oxide are transmitted to the doped region via the conductive wire to neutralize the ions in the doped region so as to reduce plasma damage to the gate oxide.

* * * * *